United States Patent
Hirai et al.

(10) Patent No.: US 10,944,360 B2
(45) Date of Patent: Mar. 9, 2021

(54) LOCAL OSCILLATOR

(71) Applicant: Mitsubishi Electric Corporation, Tokyo (JP)

(72) Inventors: Akihito Hirai, Tokyo (JP); Mitsuhiro Shimozawa, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 16/639,933

(22) PCT Filed: Sep. 19, 2017

(86) PCT No.: PCT/JP2017/033705
§ 371 (c)(1),
(2) Date: Feb. 18, 2020

(87) PCT Pub. No.: WO2019/058419
PCT Pub. Date: Mar. 28, 2019

(65) Prior Publication Data
US 2020/0252070 A1 Aug. 6, 2020

(51) Int. Cl.
*H03B 27/00* (2006.01)
*H03B 5/12* (2006.01)
(Continued)

(52) U.S. Cl.
CPC ........... *H03B 27/00* (2013.01); *H03B 5/1212* (2013.01); *H03L 7/099* (2013.01); *H03L 7/24* (2013.01);
(Continued)

(58) Field of Classification Search
CPC .... H03B 27/00; H03B 5/1228; H03B 5/1215; H03B 5/1243; H03B 2200/0078;
(Continued)

(56) References Cited

U.S. PATENT DOCUMENTS 7,911,284 B2 * 3/2011 Kuwano ................ H03B 5/124
331/109
8,258,887 B1 9/2012 Nedovic
(Continued)

FOREIGN PATENT DOCUMENTS

EP  1 608 063 A2  12/2005
GB  2 453 046 A   3/2009
(Continued)

OTHER PUBLICATIONS

Axelrad et al., "A Multi-phase 10 GHz VCO in CMOS/SOI for 40 Gbits/s SONET OC-768 Clock and Data Recovery Circuits," IEEE Radio Frequency Integrated Circuits Symposium, Jun. 2005, pp. 573-576.
(Continued)

*Primary Examiner* — Ryan Johnson
(74) *Attorney, Agent, or Firm* — Birch, Stewart, Kolasch & Birch, LLP

(57) ABSTRACT

A local oscillator of the present invention includes: a frequency generator for outputting first and second sinusoidal signals having the same frequency but mutually different phases; a phase detector for outputting either a positive or a negative voltage depending on whether a phase difference between the first and second sinusoidal signals output from the frequency generator is greater than a reference phase difference; and a comparator for outputting a comparison result between a voltage output from the phase detector and a reference voltage, or a comparison result between the voltage output from the phase detector and a voltage obtained by inverting the polarity of the voltage, in which the frequency generator controls the phase of the first sinusoidal signal so that the phase difference approaches the reference phase difference by using the comparison result output from the comparator, enabling generating IQ signals
(Continued)

having higher phase accuracy than conventional local oscillators.

10 Claims, 7 Drawing Sheets

(51) Int. Cl.
*H03L 7/099* (2006.01)
*H03L 7/24* (2006.01)
(52) U.S. Cl.
CPC .............. *H03B 2200/004* (2013.01); *H03B 2200/0078* (2013.01); *H03L 2207/06* (2013.01)
(58) Field of Classification Search
CPC ... H03B 5/124; H03B 2200/004; H03L 7/099; H03L 2207/06; H03L 7/24; H03D 3/009
See application file for complete search history.

(56) References Cited

U.S. PATENT DOCUMENTS

| | | |
|---|---|---|
| 2004/0263262 A1 | 12/2004 | Ravi et al. |
| 2006/0267700 A1 | 11/2006 | Kinoshita et al. |
| 2008/0079508 A1 | 4/2008 | Byun et al. |
| 2009/0201065 A1 | 8/2009 | Kuwano et al. |
| 2010/0164633 A1 | 7/2010 | Hoshino et al. |
| 2011/0170875 A1 | 7/2011 | Yamashita et al. |

FOREIGN PATENT DOCUMENTS

| | | |
|---|---|---|
| JP | 2001-345727 A | 12/2001 |
| JP | 2011-24025 A | 2/2011 |
| JP | 2017-130784 A | 7/2017 |
| WO | WO 92/15149 A1 | 9/1992 |
| WO | WO 2011/062114 A1 | 5/2011 |
| WO | WO 2017/077612 A1 | 5/2017 |

OTHER PUBLICATIONS

Hartmann et al., "A 77 GHz SiGe Mixer Circuit with LO Active Frequency Multiplier for Automotive Radar," Microwave Integrated Circuits Conference, Sep. 2010, pp. 206-209.
International Search Report (PCT/Isa/210) issued in PCT/JP2017/033705, dated Nov. 7, 2017.
Office Action dated Jan. 21, 2021 in corresponding European Application No. 17925617.7.

\* cited by examiner

LOCAL OSCILLATOR

TECHNICAL FIELD

The present invention relates to a local oscillator for generating a sinusoidal signal in a communication device.

BACKGROUND ART

Semiconductor integrated circuits for processing high-frequency reception signals are used in wireless communication devices. Since quadrature signal processing is performed, for example, in a semiconductor integrated circuit included in a direct conversion receiver for communication, an in-phase quadrature (IQ) signal source having a phase difference of 90 degrees is required as a local oscillator in frequency conversion processing. Also in a case where image rejection frequency converting processing is performed in a heterodyne receiver, IQ signals are likewise required in a local source output from a local oscillator when complex signal processing is performed.

It is known that the signal frequency interferes with the local source and degrades phase noise characteristics and spurious characteristics particularly in a direct conversion method in which the frequency of a local source and the signal frequency have similar values, and there are approaches such as a frequency division approach, in which the local source is caused to oscillate at twice or four times a desired frequency, and the rising and falling edges are used in the former case, whereas only the rising edge is used in the latter case, and a frequency multiplication approach in which the local source is caused oscillate at half or quarter a desired frequency, and then is multiplied by 2 or 4. In particular, at a frequency equal to or greater than the millimeter wave band of several tens of GHz, it is difficult to implement the oscillator in the former case, and therefore the latter multiplication approach is used. Non-Patent Literature 1 proposes a method using a quadruple multiplier in order to implement a local source in the millimeter wave band.

A multiphase voltage-controlled oscillator (VCO) can implement output having a plurality of phase differences in a local oscillator by using a plurality of voltage-controlled oscillators having the same characteristics. In addition, a local oscillator using voltage-controlled oscillators having a differential configuration is capable of implementing a phase of (the number of voltage-controlled oscillators×2), and the phase difference is obtained as 360/(the number of voltage-controlled oscillators×2). Since semiconductor integrated circuit devices or the like can be manufactured with a relative element value variation within a chip, of equal to or less than several to 0.5%, the phase difference of the plurality of voltage-controlled oscillators falls within the above range of variation.

CITATION LIST

Patent Literatures

Non-Patent Literature 1: M. Hartmann, C. Wagner, K. Seemann, H. Jagaer, R. Weigel, "77 GHz SiGe Mixer Circuit with LO Active Frequency Multiplier for Automotive Radar", Microwave Integrated Circuits Conference (EuMIC), 2010 European, 27-28 Sep. 2010.

Non-Patent Literature 2: D. Axelrad, E. de Foucauld, M. Boasis, P. Martin, P. Vincent, M. Belleville, F. Gaffiot, "A multi-phase 10 GHz VCO in CMOS/SOI for 40 Gbits/s SONET OC-768 clock and data recovery circuits", 2005 IEEE Radio Frequency integrated Circuits (RFIC) Symposium, 12-14 Jun. 2005

SUMMARY OF INVENTION

Technical Problem

Conventional local oscillators have a disadvantage that it is difficult to generate accurate IQ signals having a phase accuracy of equal to or less than 0.5% (1.8 degrees) of variation due to deterioration in the phase accuracy due to element variation in the chip even when a multiphase voltage-controlled oscillator (VCO) is manufactured using a semiconductor integrated circuit device.

The present invention has been made in order to solve the disadvantage as described above, and an object of the present invention is to obtain a local oscillator for generating IQ signals having higher phase accuracy than conventional local oscillators.

Solution to Problem

A local oscillator according to the present invention includes: a frequency generator having a circuit coupling in ring-shape 2N voltage-controlled oscillators (where N is an integer larger than or equal to 2) which control oscillation frequencies by an input voltage, for outputting first and second sinusoidal signals by generating the first sinusoidal signals using outputs of even number-th voltage-controlled oscillators included in the 2N voltage-controlled oscillators, and generating the second sinusoidal signals having same frequencies and different phases as the first sinusoidal signals using outputs of odd number-th voltage-controlled oscillators included in the 2N voltage-controlled oscillators; a phase detector for outputting either a positive or a negative voltage depending on whether a phase difference between the first and second sinusoidal signals output from the frequency generator is greater than a reference phase difference; and a comparator for outputting a control voltage defined by a voltage difference between a voltage output from the phase detector and a reference voltage, or a voltage difference between the voltage output from the phase detector and a voltage obtained by inverting the polarity of the voltage, in which the frequency generator controls the phase of the first sinusoidal signal so that the phase difference approaches the reference phase difference by using the control voltage output from the comparator.

Advantageous Effects of Invention

According to a local oscillator of the present invention, it is possible to generate an IQ signals having higher phase accuracy than conventional local oscillators.

DESCRIPTION OF EMBODIMENTS

First Embodiment

Embodiments of the present invention will be described below.

Figure 1:
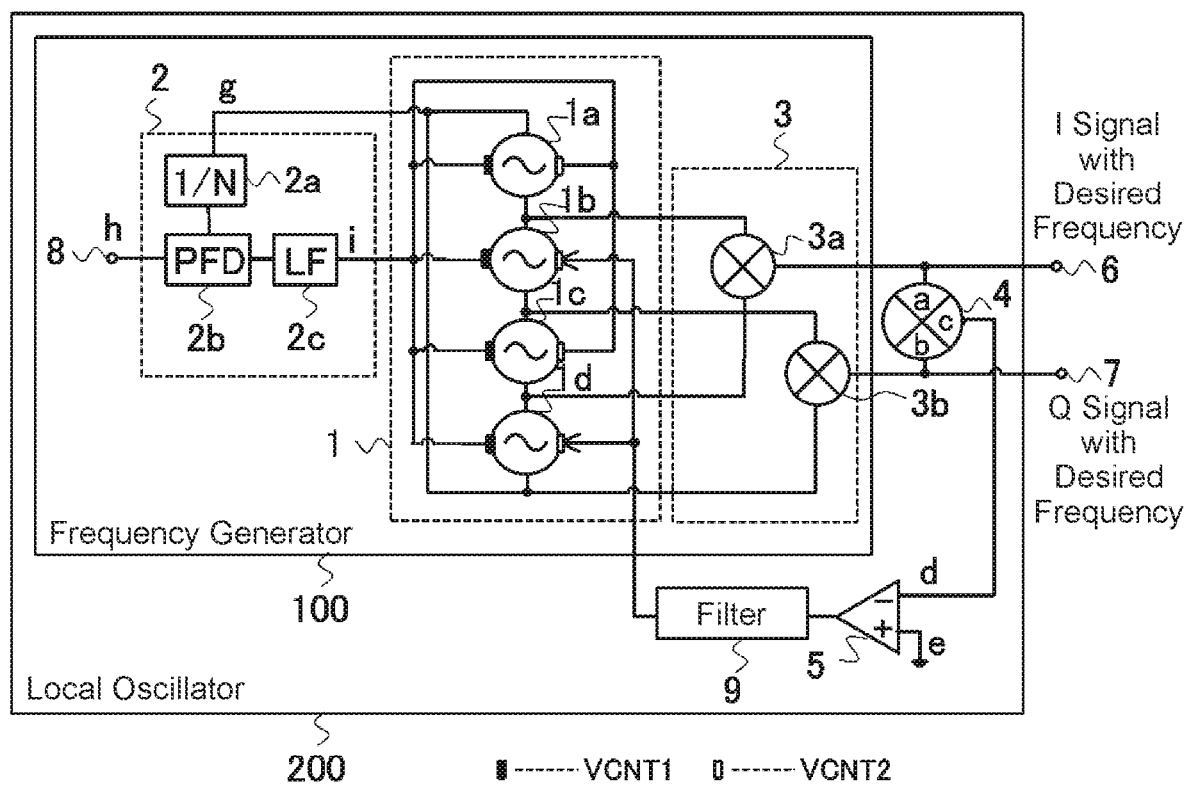
FIG. 1 is a circuit diagram of a local oscillator 200 described in a first embodiment of the present invention.

FIG. 1 is a circuit diagram illustrating a first embodiment of a local oscillator 200 according to the present invention, which functions as an IQ signal source. The local oscillator 200 includes a frequency generator 100 including a multiphase voltage-controlled oscillator (multiphase VCO) 1, a phase locked loop (PLL) 2, and a multiplier group 3, a phase detector 4, a comparator 5, and a filter 9. The local oscillator 200 outputs sinusoidal signals from an in-phase (I) output terminal 6 and a quadrature (Q) output terminal 7, and receives input of a reference signal used in the phase locked loop (PLL) 2 from a reference signal input terminal 8.

The multiphase VCO 1 includes four voltage-controlled oscillators 1a, 1b, 1c, and 1d, and coupling each of them in a ring shape enables output of multiphase sinusoidal signals. In a case where the voltage-controlled oscillators 1a, 1b, 1c, and 1d have a differential configuration, the voltage-controlled oscillators 1a, 1b, 1c, and 1d output sinusoidal signals having phases of 0, 45, 90, and 135 degrees, respectively, in a differential manner.

Figure 2:
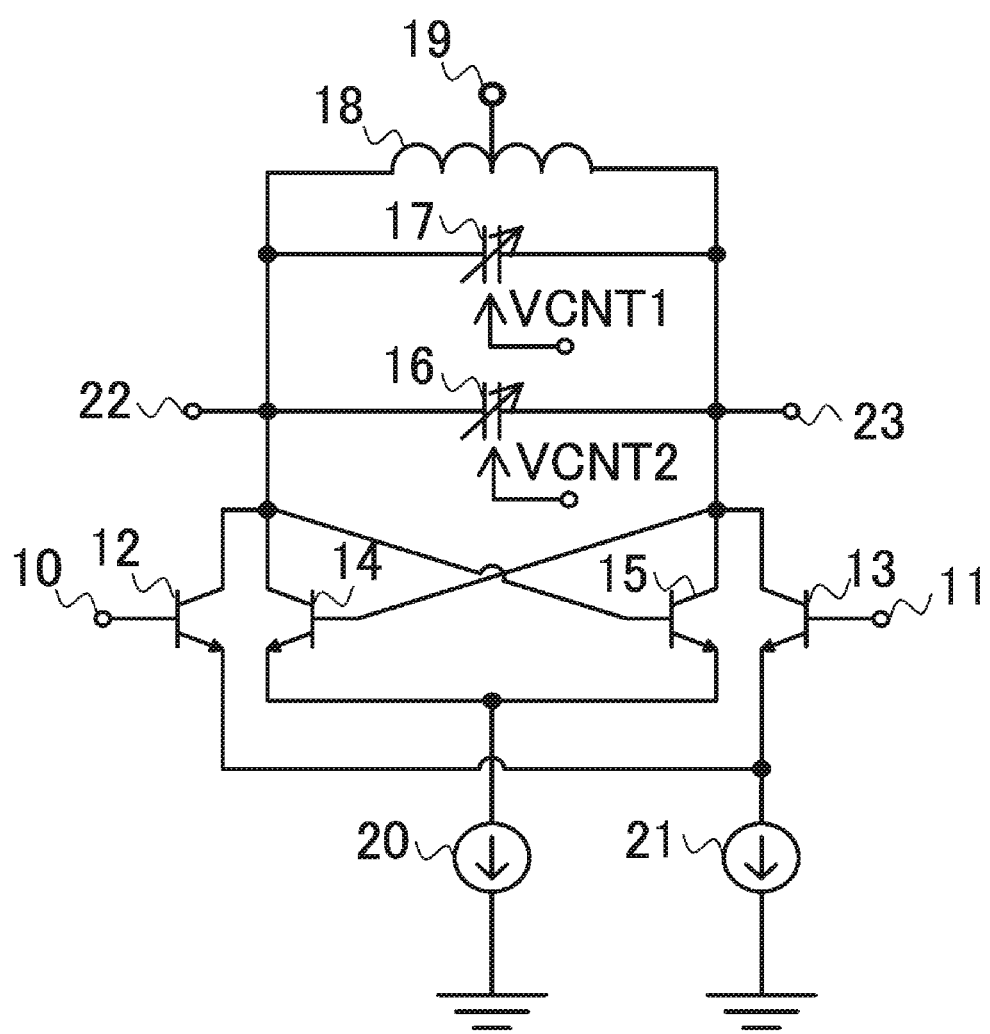
FIG. 2 is a circuit diagram of voltage-controlled oscillators 1a, 1b, 1c, and 1d described in the first embodiment of the present invention.

FIG. 2 is a diagram illustrating the configurations of the voltage-controlled oscillators 1a, 1b, 1c, and 1d. The configurations of the voltage-controlled oscillators 1a, 1b, 1c, and 1d are the same, and a single configuration is illustrated in FIG. 2. As illustrated in FIG. 2, the voltage-controlled oscillators 1a, 1b, 1c, and 1d each include an inductor and a plurality of variable capacitors. Each of the voltage-controlled oscillators 1a, 1b, 1c, and 1d includes coupled signal input ports 10 and 11, transistors 12, 13, 14, and 15, a sub variable capacitor 16, a main variable capacitor 17, an inductor 18, a power supply terminal 19, current sources 20 and 21, and output terminals 22 and 23. The voltage-controlled oscillators 1a, 1b, 1c, and 1d have a differential configuration. The voltage-controlled oscillators 1a, 1b, 1c, and 1d each operate as an oscillator with an LC parallel resonance circuit, including the inductor 18, the main variable capacitor 17, and the sub variable capacitor 16, used as a load and the transistors 14 and 15 connected to be positive feedback. The transistors 12 and 13 are connected so as to amplify signals input from the coupled signal input ports 10 and 11 and to input the amplified signals to ends of the LC resonance circuit. It is assumed that all elements are manufactured by a semiconductor process and that mismatch variation (intra-integrated circuit (IC) variation) in the phase accuracy of equal to or less than 0.5% occurs.

The multiplier group 3 in FIG. 1 includes a multiplier 3a and a multiplier 3b, and multiplies outputs of two sinusoidal signals having a difference of 90 degrees among the outputs of the multiphase VCO 1 and outputs the multiplied signal. In this example, the multiplier 3a multiplies a 0-degree sinusoidal signal of the voltage-controlled oscillator 1a and a 90-degree sinusoidal signal of the voltage-controlled oscillator 1c and outputs the multiplied signal, and the multiplier 3b multiplies a 45-degree sinusoidal signal of the voltage-controlled oscillator 1b and a 135-degree sinusoidal signal of the voltage-controlled oscillator 1d and outputs the multiplied signal. The multipliers each output a sinusoidal signal having a frequency of (frequency output from voltage-controlled oscillators)×2 and a direct current (DC) component since the multipliers output frequencies obtained by adding and subtracting signal frequencies input thereto. Also, regarding the output phase of the sinusoidal signals, the multipliers output the sum of the phases of each of input signals, and thus the multiplier 3a outputs a signal of 90 degrees obtained by adding 0 degrees of the voltage-controlled oscillator 1a and 90 degrees of the voltage-controlled oscillator 1c, and the multiplier 3b outputs a signal of 180 degrees obtained by adding 45 degrees of the voltage-controlled oscillator 1b and 135 degrees of the voltage-controlled oscillator 1d.

The frequency generator 100 outputs first and second sinusoidal signals having the same frequency and different phases from the multipliers 3a and 3b. As a typical example, the first and second sinusoidal signals have a difference of 90 degrees.

Figure 3A:
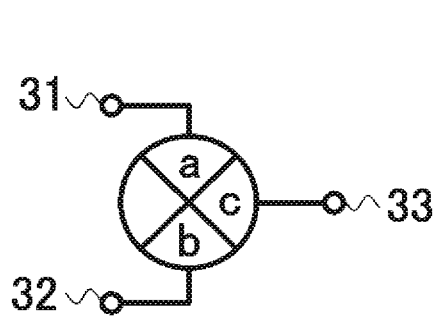
FIG. 3 includes a circuit diagram and a graph of characteristics of a phase detector 4 described in the first embodiment of the present invention.
Figure 3B:
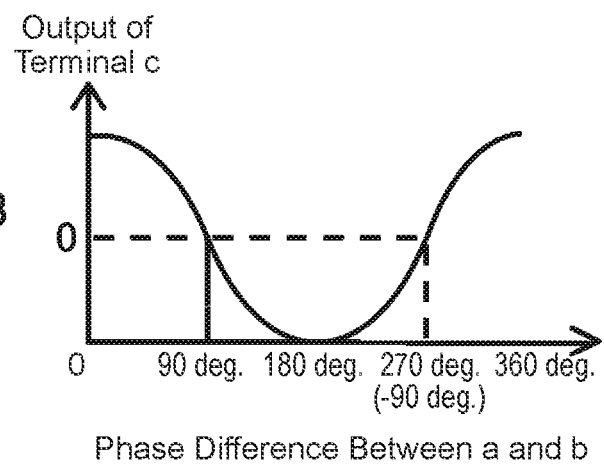

The phase detector 4 includes a multiplier as illustrated in FIG. 3A. With the multiplier illustrated in FIG. 3A, when input signals from the two input terminals 31 and 32 have a reference phase difference (phase difference of 90 degrees in FIG. 3B), 0 V is output from the output terminal 33 which is the output of a terminal c as illustrated in FIG. 3B. When input signals have a phase difference smaller than the reference phase difference (phase difference of 90 degrees in FIG. 3B), the output is greater than 0 V, and when input signals have a phase difference greater than the reference phase difference (phase difference of 90 degrees in FIG. 3B), the output is smaller than 0 V. Note that the phase detector 4 including the multiplier is less susceptible to production variations in detection characteristics only around a phase difference of 90 degrees, and can achieve a phase detection accuracy equal to or less than 0.5 degrees in general. Also as illustrated in FIG. 3B, the voltage output from the phase detector 4 approaches 0 as the phase difference of input signals approaches the reference phase difference (phase difference of 90 degrees in FIG. 3B).

The comparator 5 compares the voltages of the two input terminals d and e. When the voltage of a terminal d is greater than the voltage of a terminal e, HIGH is output that is equivalent to the power supply voltage, and LOW is output which is around 0 V in the opposite case. The filter 9 is a low-pass filter, and has a function of outputting only components equal to or less than a time constant set by the filter. It is assumed here for simplicity that only the DC components are output. The PLL 2 is a general PLL including a frequency divider 2a, a phase frequency comparator (phase frequency detector: PFD) 2b, and a loop filter (LF) 2c, and has an RF input terminal g, a reference signal input terminal h, and a terminal i for outputting a phase comparison result. The PLL 2 has functions of dividing a signal input from the RF input terminal g by the frequency divider 2a at a set frequency division number and comparing with a signal of the reference signal input terminal h by the phase frequency comparator 2b and outputting a voltage corresponding to the phase frequency from the terminal i.

Output of the multiplier 3a is connected to a terminal a of the phase detector 4, and output of the multiplier 3b is output to a terminal b of the phase detector 4. The output terminal c of the phase detector 4 is connected to the terminal d, which is one of the input terminals of the comparator 5, and the other input terminal is connected to the terminal e. An output terminal f of the comparator 5 is connected to voltage-controlled terminals VCNT 2 of the voltage-controlled oscillators 1b and 1d in the multiphase VCO 1. Voltage-controlled terminals VCNT 1 and VCNT 2 of the voltage-controlled oscillators 1a and 1c and voltage-controlled terminals VCNT 1 of the voltage-controlled oscillators 1b and 1d are connected to the output of the PLL 2.

With the voltage-controlled oscillators 1a, 1b, 1c, and 1d coupled in a ring shape, and the VCNTs 1 of the voltage-controlled oscillators 1b and 1d and the VCNTs 1 and VCNTs 2 of the voltage-controlled oscillators 1a and 1c controlled by the PLL, causing only the control voltages of the VCNTs 2 of the voltage-controlled oscillators 1b and 1d to vary causes the output phases of the voltage-controlled oscillators 1b and 1d to vary. This is because a constant of the LC parallel resonance circuit of the voltage-controlled oscillators 1b and 1d vary with respect to a constant of the LC parallel resonance circuit of the voltage-controlled oscillators 1a and 1c. It is assumed here that the phase difference increases when VCNT 2 is high, and the phase difference decreases when VCNT 2 is low.

Here, let us assume that the voltage-controlled oscillator 1a is a reference and that the output of the voltage-controlled oscillator 1b has a phase of $45°+\alpha$, that the output of the voltage-controlled oscillator 1c has a phase of $90°+\alpha+\beta$, and that the output of the voltage-controlled oscillator 1d has a phase of $135°+\alpha+\beta+\gamma$. Here, $\alpha$, $\beta$, and $\gamma$ are phase errors generated in the voltage-controlled oscillators 1b, 1c, and 1d, respectively. Since the phases are summed, the output of the multiplier 3a is $0°+(90°+\alpha+\beta)=90°+\alpha+\beta$, and the output of the multiplier 3b is $(45°+\alpha)+(135°+\alpha+\beta+\gamma)=180°+2\alpha+\beta+\gamma$, which are output from the terminals 6 and 7, respectively. Since the error in IQ signals is obtained as a difference of the phase difference thereof from 90 degrees, $(180°+2\alpha+\beta+\gamma)-(90°+\alpha+\beta)=90°+\alpha+\gamma$ is obtained. Therefore, by comparing the phase difference of $\alpha+\gamma$ detected by the phase detector 4 by the comparator 5, and applying negative feedback to the sub capacitors VNCTs 2 of the voltage-controlled oscillators 1b and 1d, which are the adjusting means, the IQ phase error can be improved to a level close to the detection error.

Figure 4:
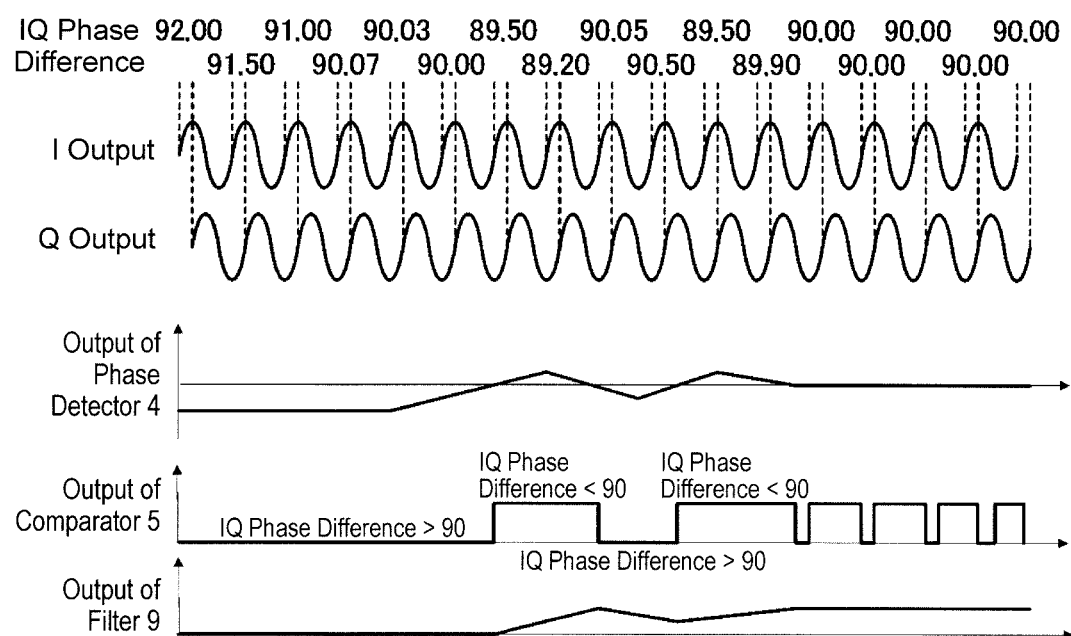
FIG. 4 is a timing chart of the main portion of the local oscillator 200 described in the first embodiment of the present invention.

Next, the temporal operation will be described. FIG. 4 illustrates a timing chart of main signals of the multiphase VCO 1. When the multiphase VCO 1 is operated, the output phase difference of the multiphase VCO 1 automatically converges to about 45°±mismatch variation (it is assumed in FIG. 4 that the maximum value of variation is 2°) due to the characteristics of the multiphase VCO 1. Moreover, when the PLL 2 is operated simultaneously, the signal frequencies output from the multiphase VCO 1 are locked to values obtained from reference signal frequency x frequency division number depending on the frequency division number set by the PLL. The multiplier 3a multiplies 0° output from the voltage-controlled oscillator 1a by $90°+\alpha+\beta$ output from the voltage-controlled oscillator 1c, and the multiplier 3b multiplies the output $45°+\alpha$ of the voltage-controlled oscillator 1b by the output $135°+\alpha+\beta+\gamma$ of the voltage-controlled oscillator 1d and outputs the result as IQ signals. Meanwhile, the phase detector 4 detects a phase error between the IQ signals generated by the multiphase VCO 1, the multiplier group 3, wiring errors, etc., and outputs the phase error as the output of the phase detector. In a case where the IQ phase difference is less than 90 degrees, a positive voltage is output. In a case where the IQ phase difference is greater than 90 degrees, a negative voltage is output. That is, depending on whether the phase difference between the two sinusoidal signals (first and second sinusoidal signals) output from the frequency generator 100 is greater than the reference phase difference (90°), either a positive or a negative voltage is output.

The comparator 5 compares the voltage output from the phase detector 4 with a reference voltage (0 V in FIG. 4), and outputs the comparison result. That is, in a case where the IQ phase difference is less than 90 degrees, HIGH is output. In a case where the IQ phase difference is greater than 90 degrees, LOW is output. The voltage output from the output terminal of the comparator 5 is filtered by the filter 9 to contain only DC voltages and is thereafter output.

A state is illustrated in FIG. 4 in which the IQ phase difference is 92 degrees and the phase detector outputs a negative voltage. Since the output of the comparator 5 also outputs LOW (0 V) and the filter also outputs 0 V, VCNT 2 becomes 0 V, and the output phases of the voltage-controlled oscillators 1b and 1d change in such a manner that the phase difference decreases. When the IQ error decreases, the output of the phase detector 4 changes in such a manner that the magnitude of the negative value decreases. When the phase difference becomes small, the comparator 5 repeats LOW and HIGH outputs, and is converted into a DC voltage by the filter 9 and supplied to the VCNTs 2 of the voltage-controlled oscillators 1b and 1c. By repeating this operation, the IQ phase difference converges to 90 degrees. Note that the filter has a time constant and that a delay occurs, and thus the convergence occurs with repeated overshoot.

Here, the DC voltage converted by the filter 9 is a voltage obtained by filtering HIGH and LOW output from the comparator 5, and becomes a voltage of the VCNTs 2 that allows the IQ phase difference to be just at 90 degrees. As described above, the loop including the phase detector 4, the comparator 5, the filter 9, and the multiphase VCO 1 is connected to implement negative feedback, and thus it is possible to cause the control voltages VCNTs 2 of the voltage-controlled oscillator 1b and the voltage-controlled oscillator 1d to change in such a manner that the voltage at the input terminal d of the comparator 5 equals the reference voltage (0 V), that is, the phase difference between the terminal a and the terminal b of the phase detector 4 equals the reference phase difference (90 degrees). As described above, in the present embodiment, the phase difference between the terminal a and the terminal b of the phase detector 4 can be matched to the reference phase difference (90 degrees) with high accuracy by the control by the loop implementing negative feedback. In other words, the phase difference between the first and second sinusoidal signals output from the frequency generator 100 can be matched to the reference phase difference (90 degrees) with higher phase accuracy than in the related art.

Note that the ratio of capacity values of the main variable capacitor and the sub variable capacitor of a voltage-controlled oscillator is intended to correct the phase error of about 0.5%, and thus compensation can be carried out sufficiently with a phase shift amount of about several to 10 degrees. Therefore, the capacity value of the sub variable capacitor of about 1/10 of the main variable capacitor can sufficiently give necessary characteristics. By allowing the capacity value of the main variable capacitor to be sufficiently larger than the value of the sub variable capacitor, it becomes possible to maintain a wide frequency range that can be controlled by the PLL, thereby enabling implementation of a broadband and highly accurate multiphase VCO.

Figure 5:
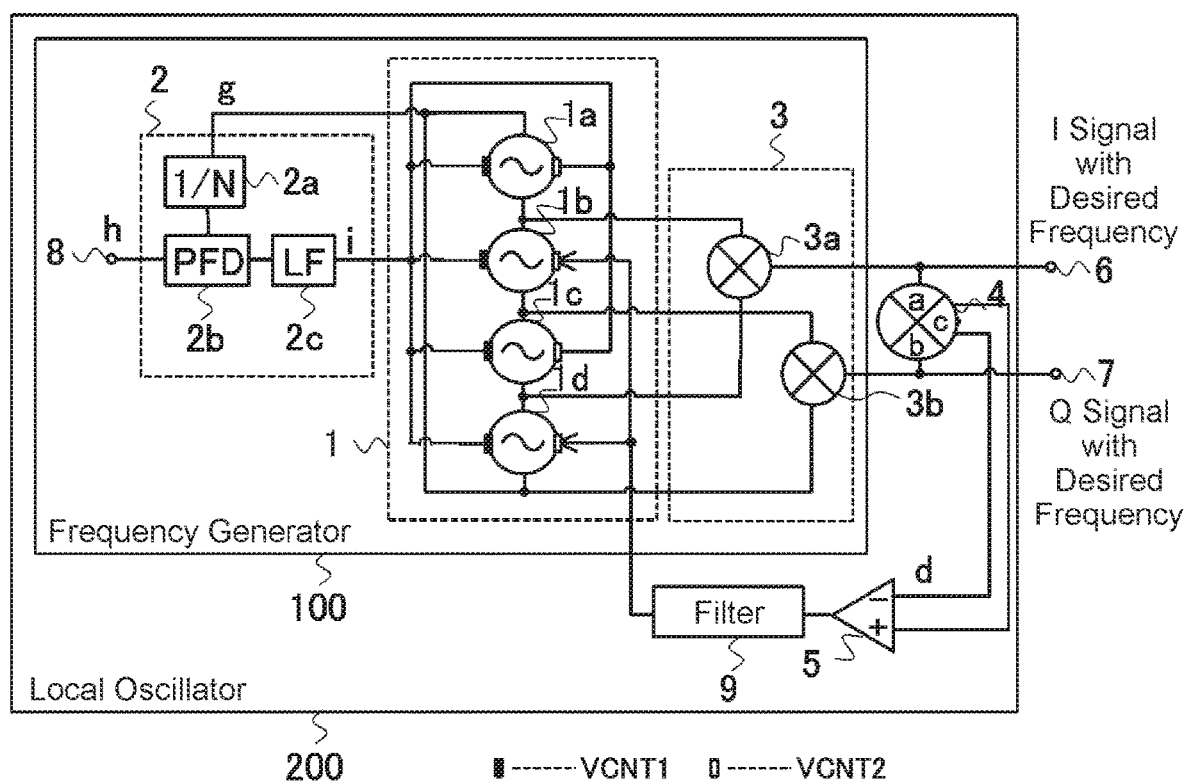
FIG. 5 is an exemplary circuit diagram of the local oscillator 200 described in the first embodiment of the present invention, which is different from FIG. 1.

In this manner, by providing two control voltage mechanisms for controlling the frequency to the voltage-controlled oscillators of the multiphase VCO 1 and, among the voltage-controlled oscillators included in the multiphase VCO, by controlling the control voltage of a second one of every two voltage-controlled oscillators by a second PLL, that is, by controlling using a comparison result obtained by detecting the phases of the IQ outputs of the Q-VCO, and by controlling the other control voltages by the first PLL, it becomes possible to detect and correct a phase error equal to or less than the mismatch variation of the multiphase VCO with a detection accuracy around that of the phase detector 4, thereby enabling implementation of a highly accurate IQ signal source. Note that although the negative feedback loop is applied to the VCNTs 2 of the voltage-controlled oscillators 1b and 1d in this example, similar effects can be obtained when the negative feedback loop is applied to the VCNTs 2 of the voltage-controlled oscillators 1a and 1c. Moreover, although the output of the phase detector 4 has a single phase, a differential configuration may be adopted as illustrated in FIG. 5. In the case of the differential configuration illustrated in FIG. 5, a phase detector 4 outputs two pieces of output of the output c illustrated in FIG. 3B and output obtained by inverting the sign of the output c. There is an advantage that the comparison voltage of a comparator 5 becomes unnecessary with the comparator 5 comparing the two pieces of output having been output from the phase detector 4.

Note that the case where the reference phase difference is 90° has been mainly described in the present embodiment, however, the reference phase difference is not limited to 90°. The reference phase difference may be 270°. Furthermore, in an environment where the first and second sinusoidal signals output from the local oscillator 200 are subjected to a phase change, the reference phase difference can be set to a value other than 90° or 270° in order to compensate for the phase change. Therefore, the reference phase difference is not limited to 90° nor 270°.

As described above, the local oscillator 200 according to the first embodiment includes: the frequency generator 100 for outputting the first and second sinusoidal signals having the same frequency but mutually different phases; the phase detector 4 for outputting either a positive or a negative voltage depending on whether a phase difference between the first and second sinusoidal signals output from the frequency generator 100 is greater than a reference phase difference; and a comparator 5 for outputting a comparison result between a voltage output from the phase detector 4 and a reference voltage, or a comparison result between the voltage output from the phase detector 4 and a voltage obtained by inverting the polarity of the voltage, in which the frequency generator 100 controls the phase of the first sinusoidal signal so that the phase difference approaches the reference phase difference by using the comparison result output from the comparator 5. With this configuration, it becomes possible to generate IQ signals having higher phase accuracy than conventional local oscillators. In particular, this configuration is often desired in an environment with high frequencies of millimeter waves or higher and makes it possible to provide an IQ signal source with high phase accuracy at high frequencies of millimeter waves or higher.

In the local oscillator 200 according to the first embodiment, the voltage output from the phase detector 4 approaches 0 as the phase difference between the first and second sinusoidal signals output from the frequency generator 100 approaches the reference phase difference. With this configuration, the loop including the phase detector 4, the comparator 5, the filter 9, and the multiphase VCO 1 is connected so as to apply negative feedback, and the control to cause the phase difference between the terminals a and b of the phase detector 4 to converge to the reference phase difference (90 degrees) can be performed smoothly. As a result, it becomes possible to generate IQ signals having higher phase accuracy than conventional local oscillators.

In the local oscillator 200 according to the first embodiment, the reference phase difference is 90° or 270°. With this configuration, the frequency generator 100 has a phase difference of 90°.

It becomes possible to provide an IQ signal source which is capable of outputting first and second sinusoidal signals, has higher phase accuracy than conventional local oscillators, and can be easily applied to communication devices.

The frequency generator 100 according to the first embodiment includes a plurality of voltage-controlled oscillators for controlling the oscillation frequency depending on a voltage input thereto. With this configuration, the phase difference between the first and second sinusoidal signals can be controlled with high accuracy by controlling the voltage input to some of the voltage-controlled oscillators.

In addition, the plurality of voltage-controlled oscillators is coupled in a ring shape in the frequency generator 100 according to the first embodiment. Coupling the plurality of voltage-controlled oscillators in a ring shape allows the plurality of voltage-controlled oscillators to output multi-phase sinusoidal signals.

Furthermore, the frequency generator 100 according to the first embodiment includes two sets of pluralities of voltage-controlled oscillators for controlling an oscillation frequency depending on a voltage input thereto. A first set of a plurality of voltage-controlled oscillators out of the two sets of the pluralities of voltage-controlled oscillators generates the first sinusoidal signal, and a second set of a plurality of voltage-controlled oscillators out of the two sets of the pluralities of voltage-controlled oscillators generates the second sinusoidal signal. With this configuration, it becomes possible to generate the first sinusoidal signal by multiplication between sinusoidal signals output from the first set of the plurality of voltage-controlled oscillators, thereby allowing the frequency of the sinusoidal signals output from the first set of the plurality of voltage-controlled oscillators to be different from the frequency of the first sinusoidal signal. As a result, in a communication device, it becomes possible to reduce interference that the sinusoidal signals output from the first set of the plurality of voltage-controlled oscillators cause on the frequency band of the first sinusoidal signal. Similar effects can be obtained also for sinusoidal signals output from the second set of the plurality of voltage-controlled oscillators.

The frequency generator 100 according to the first embodiment controls the phase of the first sinusoidal signal by controlling voltages input to the first set of the plurality of voltage-controlled oscillators by using the comparison result output from the comparator 5. With this configuration, it becomes possible in a communication device to reduce interference that the sinusoidal signals output from the first set of the plurality of voltage-controlled oscillators cause on the frequency band of the first sinusoidal signal and to control the phase difference between the first and second sinusoidal signals with high accuracy.

The frequency generator 100 according to the first embodiment also controls voltages input to the second set of the plurality of voltage-controlled oscillators by a phase locked loop (PLL) for outputting a DC voltage on the basis of a comparison between a frequency obtained by dividing a frequency of a sinusoidal signal output from a part of the second set of the plurality of voltage-controlled oscillators and a frequency of a reference signal. With this configuration, the frequency of the sinusoidal signal output from the second set of the plurality of voltage-controlled oscillators can be matched to an integer multiple of the frequency of the reference signal by the PLL. As a result, in a case where the phase noise included in the frequency of the reference signal is low, it becomes possible to suppress also the phase noise included in the frequency of the sinusoidal signals output from the second set of the plurality of voltage-controlled oscillators to a low level.

Furthermore, in the frequency generator 100 according to the first embodiment, the first set of the plurality of voltage-controlled oscillators generates the first sinusoidal signal by multiplying sinusoidal signals output therefrom, and the second set of the plurality of voltage-controlled oscillators generates the second sinusoidal signal by multiplying sinusoidal signals output therefrom. With this configuration, the frequency of the sinusoidal signals output from the first set of the plurality of voltage-controlled oscillators can be caused to be different from the frequency of the first sinusoidal signal. As a result, in a communication device, it becomes possible to reduce interference that the sinusoidal signals output from the first set of the plurality of voltage-controlled oscillators cause on the frequency band of the first sinusoidal signal. Similar effects can be obtained also for the sinusoidal signals output from the second set of the plurality of voltage-controlled oscillators.

In the frequency generator 100 according to the first embodiment, each of the multiple voltage-controlled oscillators included in the frequency generator 100 includes a plurality of variable capacitors. With this configuration, the phases of the sinusoidal signals output from the plurality of voltage-controlled oscillators can be changed by changing the capacities of the plurality of variable capacitors, thereby enabling smooth control of the phases of the sinusoidal signals.

In the frequency generator 100 according to the first embodiment, a capacity ratio of the plurality of variable capacitors is equal to or greater than 10 or less than 1/10. With this configuration, it becomes possible to perform sufficient control to correct a phase error of about 0.5%, and to reduce the influence on variable capacitors controlled by the PLL, thereby allowing the influence on the phase noise characteristics determined by the PLL to be reduced.

Second Embodiment

In a second embodiment, a case is illustrated in which the number of voltage-controlled oscillators included in the multiphase VCO 1 is greater than that in the first embodiment.

Figure 6:
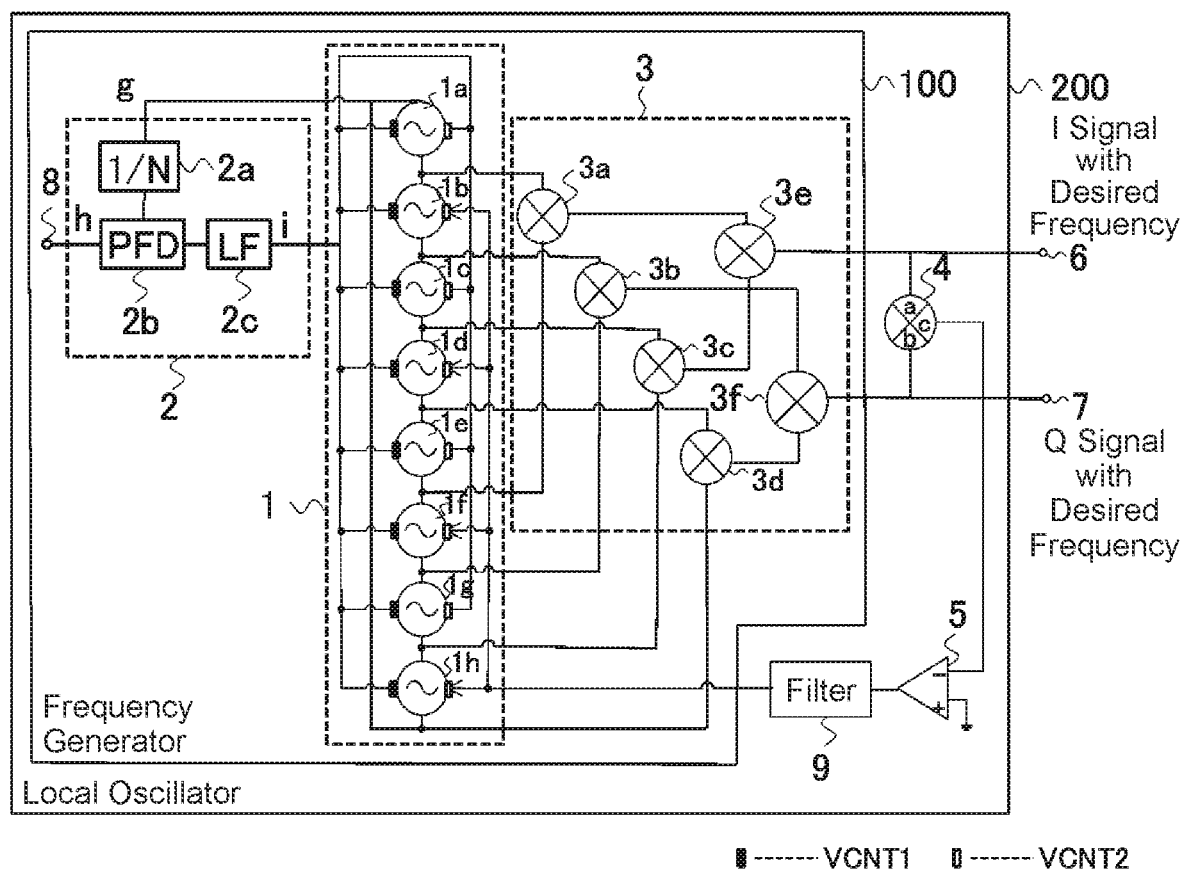
FIG. 6 is a circuit diagram of a local oscillator 200 described in a second embodiment of the present invention.

FIG. 6 is a circuit diagram illustrating the second embodiment of an IQ signal source according to the present invention. The present IQ signal source has basically the same configuration as that illustrated in FIG. 1 except for that the number of phases of the voltage-controlled oscillators included in the multiphase VCO 1 and the multiplier group 3 are modified. The other parts are the same as those in the first embodiment, and thus the same symbols are added and description thereof is omitted.

A multiphase VCO 1 includes voltage-controlled oscillators 1*a*, 1*b*, 1*c*, 1*d*, 1*e*, 1*f*, 1*g*, and 1*h*, and outputs eight phases of 0°, 22.5°, 45°, 67.5°, 90°, 112.5°, 135°, and 157.5°, respectively. In a case of a differential configuration, the multiphase VCO 1 outputs 16 phases. An oscillation frequency is set to a quarter of a desired frequency. A multiplier group 3 includes multipliers 3*a*, 3*b*, 3*c*, 3*d*, 3*e*, and 3*f*, and the multiplier 3*a* multiplies the output phase 0° of the voltage-controlled oscillator 1*a* by the output phase 90° of the voltage-controlled oscillator 1*e* and outputs a frequency having a phase of 90 degrees. The multiplier 3*b* multiplies the output phase of 22.5° of the voltage-controlled oscillator 1*b* by the output phase of 112.5° of the voltage-controlled oscillator 1*f*, and outputs a frequency having a phase of 135 degrees. The multiplier 3*c* multiplies the output phase of 45° of the voltage-controlled oscillator 1*c* by the output phase of 135° of the voltage-controlled oscillator 1*g*, and outputs a frequency having a phase of 180 degrees. The multiplier 3*d* multiplies the output phase of 67.5° of the voltage-controlled oscillator 1*d* by the output phase of 157.5° of the voltage-controlled oscillator 1*h*, and outputs a frequency having a phase of 225°.

The output frequencies of the multipliers 3*a*, 3*b*, 3*c*, and 3*d* are twice the oscillation frequency of the voltage-controlled oscillators 1*a*, 1*b*, 1*c*, 1*d*, 1*e*, 1*f*, 1*g*, and 1*h*, and is half the desired frequency. Meanwhile, the multiplier 3*e* multiplies the output phase of 90 degrees of the multiplier 3*a* and the output phase of 180 degrees of the multiplier 3*c*, and outputs a frequency having a phase of 270 degrees. The multiplier 3*f* multiplies the output phase of 135 degrees of the multiplier 3*b* and the output phase of 225 degrees of the multiplier 3*d*, and outputs a frequency having a phase of 360 degrees. As a result, IQ signals having a difference of 90° is obtained. The output frequencies of the multipliers 3*e* and 3*f* are four times the oscillation frequency of the voltage-controlled oscillators 1*a*, 1*b*, 1*c*, 1*d*, 1*e*, 1*f*, 1*g*, and 1*h*, and thus the desired frequency is obtained.

Here, let the phase errors generated in the voltage-controlled oscillators 1*b*, 1*c*, 1*d*, 1*e*, 1*f*, 1*g*, and 1*h* be $\alpha$, $\beta$, $\gamma$, $\delta$, $\varepsilon$, $\zeta$, and $\eta$, respectively, then the phases of the I signal and the Q signal of the desired signal frequency are expressed as $270°+3\alpha+3\beta+2\gamma+2\delta+\varepsilon+\zeta$ and $360°+4\alpha+3\alpha+3\gamma+2\delta+2\varepsilon+\zeta+\eta$, respectively, and thus the phase difference of the IQ signals is $90°+\alpha+\gamma+\varepsilon+\eta$. Therefore, by comparing the phase difference of $\alpha+\gamma+\varepsilon+\eta$ detected by the multiplier 4 by the comparator 5 and applying negative feedback to the voltage-controlled oscillators 1*b*, 1*d*, 1*f*, and 1*h* which are the adjusting means, the IQ phase error can be improved to a level around the detection error of the phase detector 4.

As described above, also in a case where the number of voltage-controlled oscillators included in the multiphase VCO 1 is larger than the number illustrated in the first embodiment, the IQ phase error can be improved to a level around the detection error of the phase detector 4.

Third Embodiment

In the third embodiment, a case is illustrated in which the number of voltage-controlled oscillators included in the multiphase VCO 1 is smaller than that in the first embodiment.

Figure 7:
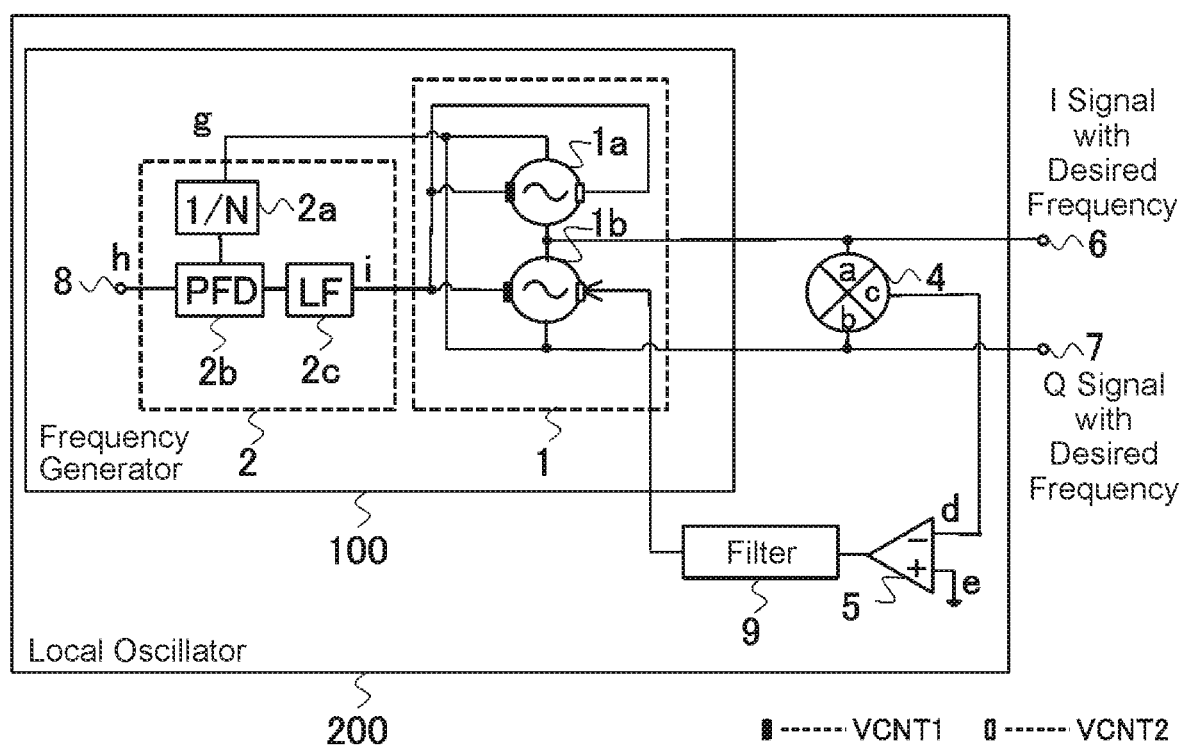
FIG. 7 is a circuit diagram of a local oscillator 200 described in a third embodiment of the present invention.

FIG. 7 is a circuit diagram illustrating a third embodiment of an IQ signal source according to the present invention. The present IQ signal source has basically the same configuration as that illustrated in FIG. 1 except for that the number of phases of the voltage-controlled oscillators included in the multiphase VCO 1 is reduced as compared to the configuration illustrated in FIG. 1 and that the multiplier group 3 is removed. The other parts are the same as those in the first embodiment, and thus the same symbols are added and description thereof is omitted.

A multiphase VCO 1 includes voltage-controlled oscillators 1*a* and 1*b*, and outputs two phases of 0° and 90°, respectively. The output frequency of the voltage-controlled oscillators 1a and 1b is a desired frequency.

Here, let us assume that the voltage-controlled oscillator 1a is a reference and that the output of the voltage-controlled oscillator 1b has a phase of 90°+α. Symbol α represents a phase error generated in the voltage-controlled oscillator 1b. In this case, the phases of an I signal and a Q signal at the desired signal frequency are 0° and 90°+α, respectively, and the phase difference between the IQ signals is 90°+α. Therefore, by detecting the phase difference of a by the phase detector 4 and then comparing the phase difference of a by the comparator 5 and applying negative feedback to the voltage-controlled oscillators 1b which is an adjusting means, the IQ phase error can be improved to a level around the detection error of the phase detector 4.

In the configuration illustrated in the present embodiment, the number of voltage-controlled oscillators included in the multiphase VCO 1 is small, and the output frequency of the voltage-controlled oscillators 1a and 1b is a desired frequency. Therefore, it is not necessary to use a multiplier group 3.

As described above, also in the present embodiment like in the first embodiment, the local oscillator 200 includes: the frequency generator 100 for outputting the first and second sinusoidal signals having the same frequency but mutually different phases; the phase detector 4 for outputting either a positive or a negative voltage depending on whether a phase difference between the first and second sinusoidal signals output from the frequency generator 100 is greater than a reference phase difference; and a comparator 5 for outputting a comparison result between a voltage output from the phase detector 4 and a reference voltage, or a comparison result between the voltage output from the phase detector 4 and a voltage obtained by inverting the polarity of the voltage, in which the frequency generator 100 controls the phase of the first sinusoidal signal so that the phase difference approaches the reference phase difference by using the comparison result output from the comparator 5. With this configuration, it becomes possible to generate IQ signals having higher phase accuracy than conventional local oscillators.

REFERENCE SIGNS LIST

1: multiphase VCO, 1a, 1b, 1c, 1d: voltage-controlled oscillator, 2: PLL (phase locked loop) 2a: frequency divider, 2b: phase frequency comparator, 2c: loop filter LP, 3: multiplier group, 3a, 3b: multiplier, 4: phase detector, 5: comparator, 6: in-phase (I) output terminal, 7: quadrature (Q) output terminal, 8: reference signal input terminal, 9: filter, 10, 11: coupled signal input port, 12, 13, 14, 15: transistor, 16: sub variable capacitor, 17: main variable capacitor, 18: inductor, 19: power supply terminal, 20, 21: current source, 22, 23: output terminal, 31, 32: input terminal, 33: output terminal, 100: frequency generator, 200: local oscillator.

The invention claimed is:

1. A local oscillator comprising:
a frequency generator having a circuit coupling in ring-shape 2N voltage-controlled oscillators, where N is an integer larger than or equal to 2, which control oscillation frequencies by an input voltage, to output first and the second sinusoidal signals by generating the first sinusoidal signals using outputs of even number-th voltage-controlled oscillators included in the 2N voltage-controlled oscillators, and generating the second sinusoidal signals having same frequencies and different phases as the first sinusoidal signals using outputs of odd number-th voltage-controlled oscillators included in the 2N voltage-controlled oscillators;
a phase detector to output either a positive or a negative voltage depending on whether a phase difference between the first and second sinusoidal signals output from the frequency generator is greater than a reference phase difference; and
a comparator to output a comparison result between a voltage output from the phase detector and a reference voltage, or a comparison result between the voltage output from the phase detector and a voltage obtained by inverting polarity of the voltage,
wherein the frequency generator controls the phase of the first sinusoidal signal or that of the second sinusoidal signal so that the phase difference approaches the reference phase difference by using the comparison result output from the comparator.

2. The local oscillator according to claim 1, wherein N is 2 or 4.

3. The local oscillator according to claim 1, wherein the frequency generator generates the first sinusoidal signal by multiplying sinusoidal signals output from each of the even number-th voltage-controlled oscillators included in the 2N voltage-controlled oscillators, and generates the second sinusoidal signal by multiplying sinusoidal signals output from each of the odd number-th voltage-controlled oscillators included in the 2N voltage-controlled oscillators.

4. The local oscillator according to claim 1, wherein the frequency generator controls the phase of the first sinusoidal signal by varying control voltages of the even number-th voltage-controlled oscillators.

5. The local oscillator according to claim 1, wherein the frequency generator controls the phase of the second sinusoidal signal by varying control voltages of the odd number-th voltage-controlled oscillators.

6. The local oscillator according to claim 1, wherein each of the 2N voltage-controlled oscillators has an electric circuit in which a main variable capacitor, a sub variable capacitor and an inductor are connected in parallel.

7. The local oscillator according to claim 6, wherein a capacity ratio between the main variable capacitor and the sub variable capacitor is less than 1/10.

8. The local oscillator according to claim 6, wherein the frequency generator controls the phase of the first sinusoidal signal by varying a control voltage of the sub variable capacitor of the even number-the voltage-controlled oscillators.

9. The local oscillator according to claim 6, wherein the frequency generator controls the phase of the second sinusoidal signal by varying the sub variable capacitor of the odd number-th voltage-controlled oscillators.

10. The local oscillator according to claim 1, wherein the frequency generator controls voltages input to the odd number-th voltage-controlled oscillators by a phase locked loop (PLL) to output a direct current voltage on a basis of a comparison between a frequency obtained by dividing a frequency of a sinusoidal signal output from the odd number-th voltage-controlled oscillators and a frequency of a reference signal.

* * * * *